United States Patent [19]

Ichikawa

[11] Patent Number: 4,560,582
[45] Date of Patent: Dec. 24, 1985

[54] METHOD OF PREPARING A SEMICONDUCTOR DEVICE

[75] Inventor: Matsuo Ichikawa, Suwa, Japan

[73] Assignee: Kabushiki Kaisha Suwa Seikosha, Tokyo, Japan

[21] Appl. No.: 618,174

[22] Filed: Jun. 7, 1984

Related U.S. Application Data

[62] Division of Ser. No. 322,307, Nov. 17, 1981, abandoned.

[30] Foreign Application Priority Data

Nov. 20, 1980 [JP] Japan ................................ 55-163564

[51] Int. Cl.$^4$ ........................................... H01L 21/38
[52] U.S. Cl. ..................................... 427/88; 148/187; 148/190; 29/571; 427/93
[58] Field of Search ...................... 29/571; 427/88, 93; 148/187, 190

[56] References Cited

U.S. PATENT DOCUMENTS

| | | | |
|---|---|---|---|
| 4,080,618 | 9/1976 | Tango | 357/23.9 |
| 4,292,728 | 10/1981 | Endo | 29/571 |
| 4,294,002 | 10/1981 | Jambotkar | 29/571 |
| 4,299,862 | 11/1981 | Donley | 427/89 |

Primary Examiner—John D. Smith
Attorney, Agent, or Firm—Blum, Kaplan, Friedman, Silberman & Beran

[57] ABSTRACT

A semiconductor device including a MOS field effect transistor formed on a single silicon crystal substrate having source and drain diffused regions of reduced depth. In order to avoid penetration of aluminum from the aluminum connector through the diffused region into the substrate, the diffused region is formed by double diffusion of at least two types of impurities of the same conductive type, but having different diffusion coefficients with respect to each other.

5 Claims, 7 Drawing Figures

METHOD OF PREPARING A SEMICONDUCTOR DEVICE

This is a division of application Ser. No. 322,307, filed Nov. 17, 1981 now abandoned.

BACKGROUND OF THE INVENTION

This invention relates to semiconductor devices, and more particularly to semiconductor devices including an MOS field effect transistor having diffused regions for forming the source and drain.

High integration and miniaturization are significant objectives in the technical development of semiconductor devices, particularly semiconductor integrated circuit devices including MOS field effect transistors. Channel length is the most significant characteristic when attempting to miniaturize the device. A transistor or integrated circuit having a channel length of about 1 micron has been prepared experimentally, and integrated circuit devices having a channel length of about 3 microns are available in mass produced units. Most integrated circuit devices manufactured today have a channel length of about 5 microns.

As the channel length is reduced, a "short channel effect" occurs. The short channel effect is when there is a punch through the source and drain and a resulting drop in threshold voltage. In order to overcome the short channel effect, the following proposals have been made:

(1) Reduce the thickness of the gate film;
(2) Heavily dope the substrate; and
(3) Reduce the depth of diffusion at the source and drain diffused region.

Of the proposals for countering the shortened channel effect, the method of reducing the depth of diffusion by ion implantation at the source and drain regions is the most common. Additionally, methods have been proposed whereas As, Sb and the like having small diffusion coefficients are used as ion sources or utilizing boron or phosphorus to decrease the implantation energy and the amount of implantation at the diffused regions.

It has been found that as the diffusion depth is reduced or the amount of the diffusion source is decreased, metal penetrates into the diffused layers at the junction region. Specifically, the punch-through effect occurs at the junction region. Some penetration can be prevented by mixing silicon, copper, or the like, into an aluminum contact, but this does not prevent penetration completely when the depth of the diffusion region is reduced to about $0.2\mu$ to $0.5\mu$.

It has also been suggested that in order to prevent penetration of aluminum a chemically stable metal, such as platinum, be disposed or a polysilicon layer be disposed between the aluminum and the contact portion. When providing a barrier by disposing a chemically stable metal, such as platinum, adhesion between the barrier layer and the single-crystal silicon substrate or phosphorous silicate glass (PSG) film is not acceptable. The number of processing steps, such as vapor deposition and etching for forming the barrier layer, are also increased. Furthermore, there is a problem in that metals, such as platinum, do not etch uniformly. When utilizing a barrier layer of PSG the PSG barrier is apt to react with the aluminum thereby changing its properties. Additionally, when etching there is the possibility that a stepped portion may occur due to overhang. Furthermore, the binding characteristics are reduced. Accordingly, it would be desirable to provide a means to prevent penetration of the aluminum without increasing the processing steps.

SUMMARY OF THE INVENTION

Generally speaking, in accordance with the invention, an improved semiconductor device including a MOS filed effect transistor formed on a single silicon crystal substrate having source and drain regions of reduced diffusion depth is provided. The punch-through effect, namely, diffusion of aluminum through the source and drain region is avoided by double diffusion. Different types of atoms of the same conductivity type, but having different diffusion coefficients, are used for forming the double diffused regions. The double diffusion utilizing different types of atoms with different diffusion coefficients may be performed without an additional masking step thereby avoiding the need for additional aligning of masks during processing.

Accordingly, it is an object of this invention to provide an improved semiconductor device.

It is another object of this invention to provide an improved semiconductor device including a MOS field effect transistor formed on a single silicon cyrstal substrate.

A further object of the invention is to provide an improved semiconductor device including an MOS field effect transistor having source and drain diffused regions of reduced depth.

Still another object of the invention is to provide an improved semiconductor device including an MOS field effect transistor wherein diffused source and drain regions are formed by diffusing different types of atoms of the same conductivity type and having different diffusion coefficients for forming the diffused regions.

Still a further object of the invention is to provide an improved process for forming a semiconductor device.

Still other objects and advantages of the invention will in part be obvious and will in part be apparent from the specification.

The invention accordingly comprises the several steps and the relation of one or more of such steps with respect to each of the others, and the apparatus embodying features of construction, combination of elements and arrangement of parts which are adapted to effect such steps, all as exemplified in the following detailed disclosure, and the scope of the invention will be indicated in the claims.

BRIEF DESCRIPTION OF THE DRAWINGS

For a fuller understanding of the invention, reference is had to the following description taken in connection with the accomanying drawings, in which.

DESCRIPTION OF THE PREFERRED EMBODIMENTS

Figure 1:
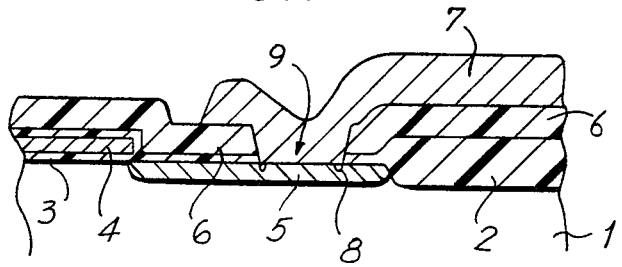
FIG. 1 is a partial cross-sectional view of the drain region of an N-channel MOS field effect transistor.

FIG. 1 illustrates in cross-section an outline of the structure of the area around the drain region of an N-channel MOS field effect transistor 10. Transistor 10 includes a field oxide film 2, a gate oxide film 3, a gate electrode 4, an N+ diffused region 5, A PSG film 6 disposed on gate oxide film 3 and a portion of N+ diffused region 5 for forming a contact hole 9. Transistor 10 also includes Al connector 7 disposed on PSG film 6 and the exposed region of N+ diffused region 5. Transistor 10 is formed on a P-type single crystal silicon substrate 1.

As shown in FIG. 1, an alloy pit 8 forms in N+ diffused region 5 between aluminum connector 7 in contact hole 9 at the periphery thereof and penetrates to a point that it diffuses into single crystal silicon substrate 1. When N+ diffused region 5 is shallow, the distance from the point of alloy pit 8, or the aluminum diffused point to the bottom of N+ diffused region 5 is shallow and the punch-through effect noted above occurs. The means to overcome this problem are as follows.

Figure 2:
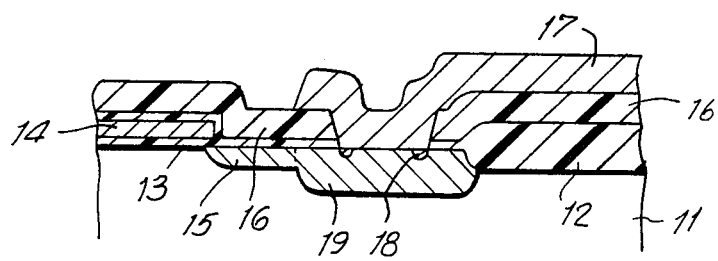
FIG. 2 is a cross-sectional view of of the drain region of an N-channel MOS field effect transistor having a deeper diffused region than the transistor of FIG. 1.
Figure 3:
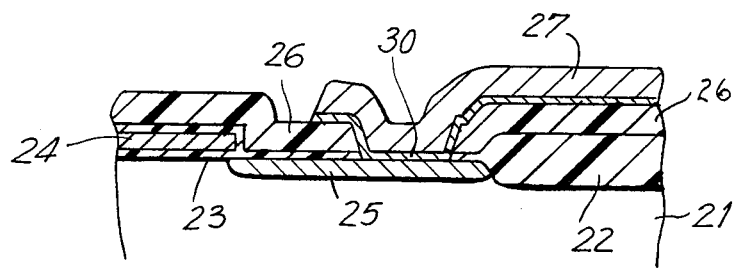
FIG. 3 is a cross-sectional view of the drain region of an N-channel MOS field effect transistor including a platinum barrier between the contact hole and drain.

The principal method is to form the N+ diffusion region more deeply in the area corresponding to contact portion 9 as shown in FIG. 2. Alternatively, a barrier, such as a platinum layer 30, is disposed below aluminum connector 27 in order to prevent penetration as illustrated in FIG. 3. If deepened N+ diffused region 19 is formed in a separate processing step from that for forming diffused regions forming the source and drain 15, as shown in FIG. 2, the disadvantage arises that the channel width must be large enough to compensate for errors in mask alignment in the photo-chemical etching processing step and the diffusion step.

When barrier layer 30, as shown in FIG. 3, is provided additional disadvantages arise. Firstly, It is difficult to contact firmly barrier layer 30 with single-crystal silicon substrate 21 or to PSG film 26. Secondly, processing steps, such as vapor deposition and etching for forming barrier layer 30 must be included in the processing. Moreover, even disposing platinum barrier layer 30 between aluminum connector 7 and diffusion region 25 does not prevent penetration of aluminum completely. It is also possible to limit penetration of aluminum to some extent by admixing Si, Cu, or the like into the aluminum connector. However, even this does not prevent penetration completely when the diffusion depth is reduced, for example, to about $0.2\mu$ to $0.5\mu$.

Figure 4:
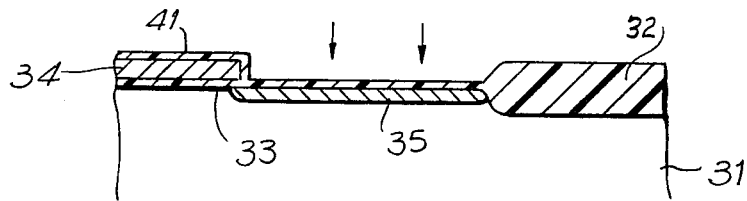
FIG. 4 is a cross-sectional view of the drain region of an N-channel MOS outlining a step in the method of preparing the N-channel MOS field effect transistor in accordance with the invention.
Figure 5:
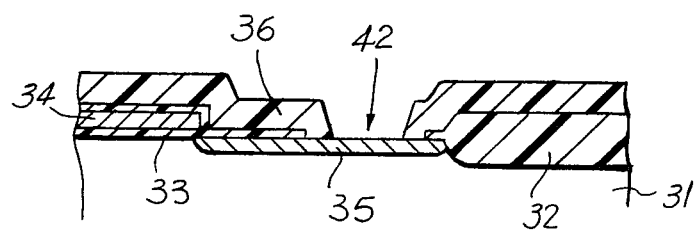
FIG. 5 is a cross-sectional view of the device of FIG. 4 including a PSG film.

Turning now to FIGS. 4–7, the processing steps for preparing a MOS semiconductor device in accordance with the invention will be described. As shown in FIG. 4, a field oxide film 32 is formed on a P-type single crystal silicon substrate 31 by selective oxidation. A gate oxide film 33 is formed on a portion of substrate 31 where field oxide film 32 is not formed and a gate electrode 34 is disposed on gate oxide film 33. A thin oxide film 41 is formed on gate electrode 34 and a thin N+ diffused region 35 which becomes the drain of the transistor is formed through thin oxide film 41 by ion implantation of As having a low diffusion coefficient. A PSG film 36 is then formed on gate electrode 34 and field oxide film 32 leaving a contact hole 42 in the region of N+ diffused region 35.

Figure 6:
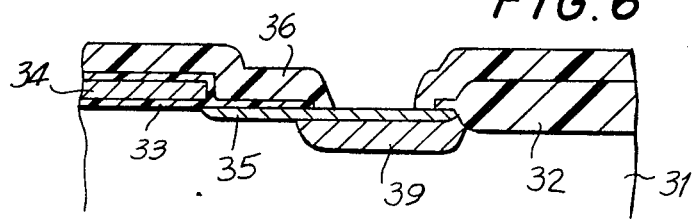
FIG. 6 is a cross-sectional view of the device of FIG. 5 including an N+diffused region of phosphorus.
Figure 7:
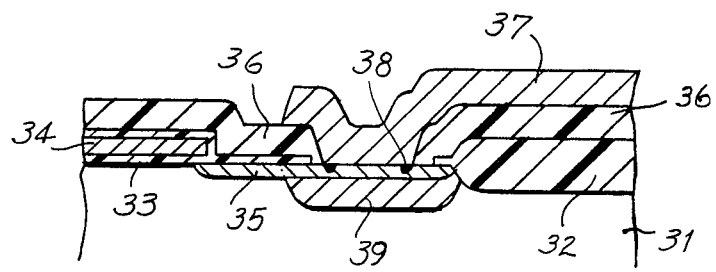
FIG. 7 is a cross-sectional view of the semiconductor device of FIGS. 4–6 including an aluminum connector constructed and arranged in accordance with the invention.

Referring specifically to FIG. 6, $P_2O_3$ is deposited by reacting $POCl_3$ with $O_2$ at diffused region 35 and a N+ diffused region 39 is formed by thermal diffusion of P ions. At this time, due to the difference of diffusion coefficients between P and As, diffused region 39 composed of P ions can be formed deeper without increasing the depth of N+ diffused region 35 composed of As ions. In this case, it is possible to increase the depth of diffusion only by N+ predeposition process, or by annealing in a nitrogen atmosphere after N+ predeposition. When the N+ predeposition is combined with reflow of PSG film, the form of the step portion and the contact portion is improved without increasing the number of processing steps. Furthermore, as shown in FIG. 7, an aluminum connector 37 may be formed by photochemical etching of aluminum film which is deposited over the surface of the substrate after eteching the surface of diffused layer 35.

Accordingly, by preparing a semiconductor device in accordance with the process of the invention as described above, it is possible to provide a construction wherein penetration of the aluminum through the diffused region is prevented by increasing the depth of the diffused region only in the region of the drain that contacts the connector. This is significant as this is accomplished without increasing the processing steps and without being required to provide increased channel width to provide a margin to account for mask alignment. In the embodiments described herein, presented by way of example, P and As have been utilized, but it is clear that the invention is applicable to other elements, or to three or more types of elements for forming the diffused regions. Additionally, in the embodiments described herein, a N-channel MOS integrated circuit has been described. It is also within the scope of the invention to apply the processing steps to a P-channel MOS integrated circuit, or complementary MOS integrated circuit. Furthermore, it is within the scope of the invention that deep diffusion step may be performed after disposing the PSG film as described, or the order of the processing steps may be changed.

It will thus be seen that the objects set forth above, among those made apparent from the preceding description, are efficiently attained and, since certain changes may be made in carrying out the above process and the construction set forth without departing from the spirit and scope of the invention, it is intended that all matter contained in the above description and shown in the accompanying drawings shall be interpreted as illustrative and not in a limiting sense.

It is also to be understood the the following claims are intended to cover all of the generic and specific features of the invention herein described and all statements of the scope of the invention which, as a matter of language, might be said to fall therebetween.

What is claimed is:

1. A method for forming a semiconductor device including an MOS field effect transistor on a single crystal silicon substrate, comprising the steps of:

forming a field oxide film on a single crystal silicon substrate with a region free of the field oxide film;

forming a gate oxide film on the region of the substrate free of the field oxide film;

depositing a gate electrode on a portion of the gate oxide film spaced apart from the field oxide film;

forming a thin oxide film on the gate electrode and the region between the gate and field oxide film;

diffusing ions into the surface of the substrate at the region between the gate and the field oxide film for forming a first N+ diffused source and/or drain regions;

forming a contact hole in the thin oxide film in the opening;

depositing a second insulating film on the surface of the thin oxide film and field oxide film;

diffusing a second atom into the surface of the substrate at the contact hole for forming a second diffused region overlapping the first diffused region and to a greater depth than the first diffused region; and forming a metal connector at the contact hole.

2. The process of claim 1, wherein the substrate is a p-type single silicon cyrstal substrate and the second N+ diffused region is formed of atoms having a larger diffusion coefficient than the atom of the first diffused retion.

3. The process of claim 2, wherein the atoms of the first N+ diffused region are As and the atoms of the second N+ diffusion region are P.

4. The process of claim 2, wherein the atoms of the first N+ diffused region are B and the atoms of the second N+ diffused region are P.

5. A method for forming a semiconductor device including an MOS field effect transistor on a single crystal silicon substrate, comprising:

forming a field oxide film on a portion of a single crystal silicon substrate with a region free of field oxide film;

forming a gate oxide film on the substrate free of the field oxide film;

depositing the gate electrode on a portion of the gate oxide film spaced apart from the field oxide film;

forming a thin oxide film on the gate electrode and the region between the gate and field oxide film;

diffusing As ions into the surface of the substrate at the region between the gate and the field oxide film for forming a first N+ diffused source and drain regions;

forming a contact hole in a portion of the thin oxide film in the opening at the diffused source and drain regions;

diffusing P atoms into the surface of the substrate at the contact openings at the source and drain regions for forming a second diffused region overlapping the first As diffused region and to a greater depth than the As diffused region; and forming a metal conductor at the contact holes.

* * * * *